United States Patent
Zhang et al.

(10) Patent No.: US 7,745,302 B2
(45) Date of Patent: Jun. 29, 2010

(54) METHOD FOR MAKING TRANSMISSION ELECTRON MICROSCOPE GRID

(75) Inventors: Li-Na Zhang, Beijing (CN); Zhuo Chen, Beijing (CN); Chen Feng, Beijing (CN); Liang Liu, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/339,337

(22) Filed: Dec. 19, 2008

(65) Prior Publication Data

US 2009/0317926 A1 Dec. 24, 2009

(30) Foreign Application Priority Data

Jun. 20, 2008 (CN) .................. 2008 1 0067934

(51) Int. Cl.
*H01L 21/76* (2006.01)
(52) U.S. Cl. .................. 438/409; 438/8; 438/960; 257/E21.006; 257/E21.134; 257/E21.218; 257/E21.245; 257/E21.324; 257/E21.329; 257/E51.04
(58) Field of Classification Search .............. 438/409, 438/513, 8, 686, 687, 788, 960; 257/E21.006, 257/134, 218, 245, 324, 329, E21.04
See application file for complete search history.

(56) References Cited

U.S. PATENT DOCUMENTS

| 6,930,313 B2 * | 8/2005 | Fujieda et al. ........... 250/423 R |
| 7,085,361 B2 * | 8/2006 | Thomas .................. 379/167.01 |
| 2006/0274889 A1 * | 12/2006 | Lu et al. ..................... 378/122 |
| 2008/0237464 A1 * | 10/2008 | Zhang et al. ................. 250/311 |

\* cited by examiner

*Primary Examiner*—David Nhu
(74) *Attorney, Agent, or Firm*—D. Austin Bonderer

(57) ABSTRACT

A method for making transmission electron microscope gird is provided. An array of carbon nanotubes is provided and drawing a carbon nanotube film from the array of carbon nanotubes. A substrate has a plurality of spaced metal girds attached on the substrate. The metal girds are covered with the carbon nanotube film and treating the carbon nanotube film and the metal girds with organic solvent. A transmission electron microscope (TEM) grid is obtained by removing remaining CNT film.

15 Claims, 10 Drawing Sheets

METHOD FOR MAKING TRANSMISSION ELECTRON MICROSCOPE GRID

BACKGROUND

1. Field of the Disclosure

The disclosure relates to a method for making an electron microscope grid, and particularly to a method for making a transmission electron microscope grid.

2. Description of Related Art

Transmission electron microscopy (TEM) is one of the most important techniques available for the detailed examination and analysis of the nano-structural characteristics of many materials. The TEM technique provides high resolution imaging and material analysis of thin specimens in the range of 0.01-0.2 microns (μm). In a conventional method for specimen preparation, a metal grid such as a copper or nickel grid covered by a porous organic membrane is provided, then evaporation is used to deposit an amorphous carbon film on the porous organic membrane. In practical application, when the size of an observed particle is less than 5 nanometers (nm), the amorphous carbon film can negatively impact TEM imaging.

Carbon nanotubes (CNTs) have a high Young's modulus, high thermal conductivity, and high electrical conductivity, a strong absorbability, among other properties, and are considered as being potentially ideal material for making TEM grids. However, there has been difficulty in applying CNTs in TEM grids.

What is needed, therefore, is a method for fabricating a TEM grid using a CNT film, wherein the TEM grid is conducive to acquiring better high resolution transmission electron microscopy images when the size of the observed structure is less than 5 nanometers.

BRIEF DESCRIPTION OF THE DRAWINGS

Many aspects of the present method for making a TEM grid can be better understood with reference to the following drawings. The components in the drawings are not necessarily drawn to scale, the emphasis instead being placed upon clearly illustrating the principles of the present method for making the TEM grid.

Figure 1:
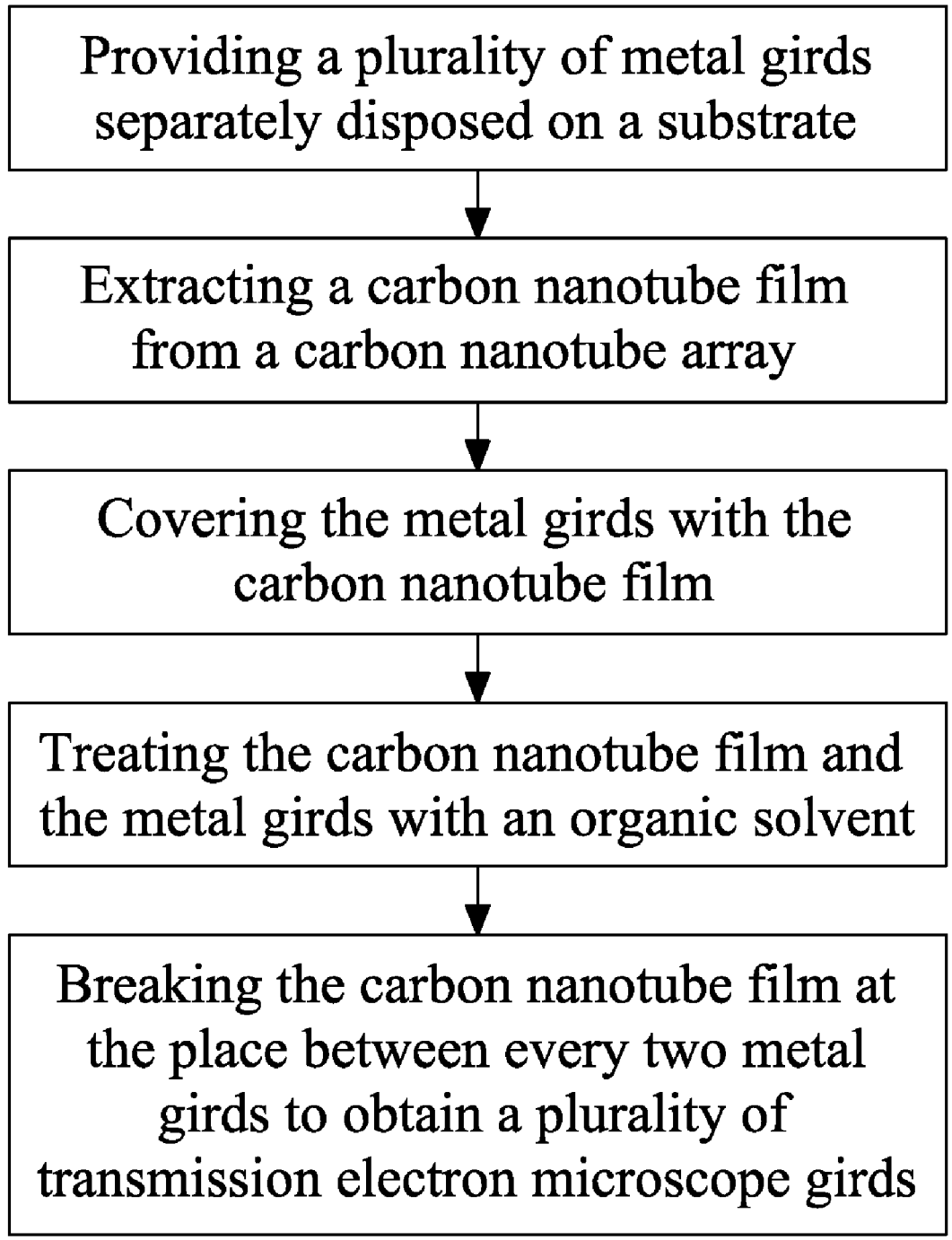
FIG. 1 is a flow chart of a method for fabricating a TEM grid, in accordance with one embodiment.
Figure 2A:
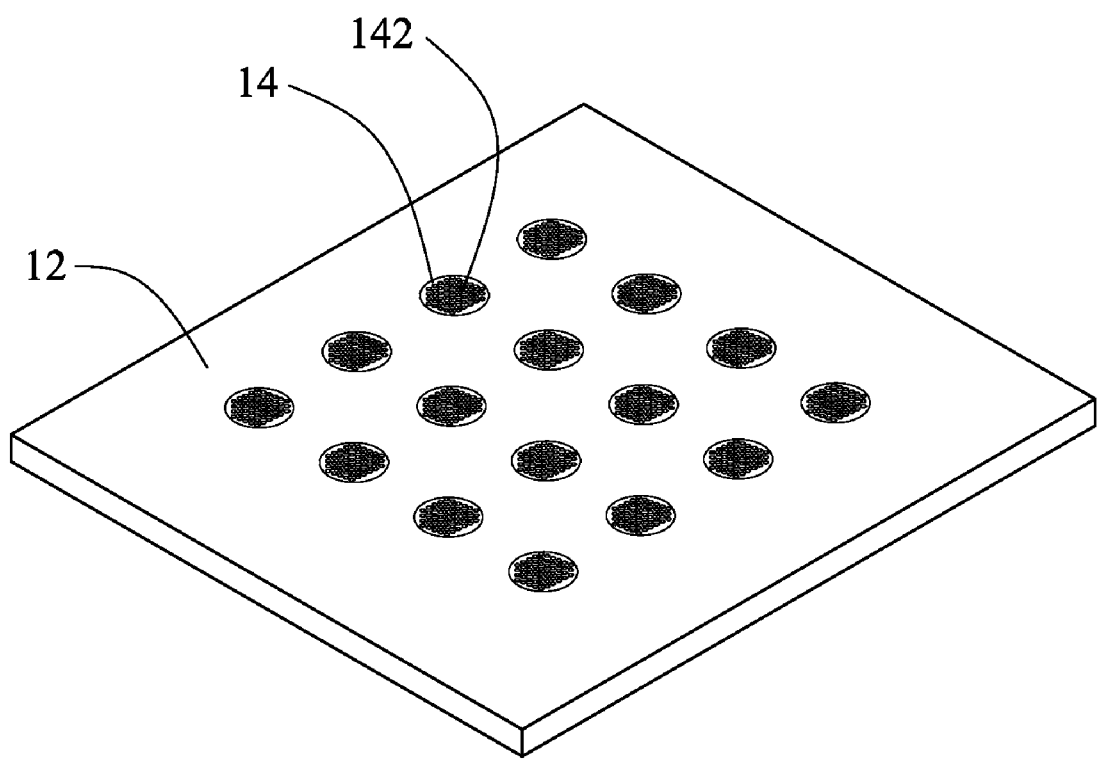
FIGS. 2A-2D illustrate the preparation of the TEM grid of FIG. 1.
Figure 2B:
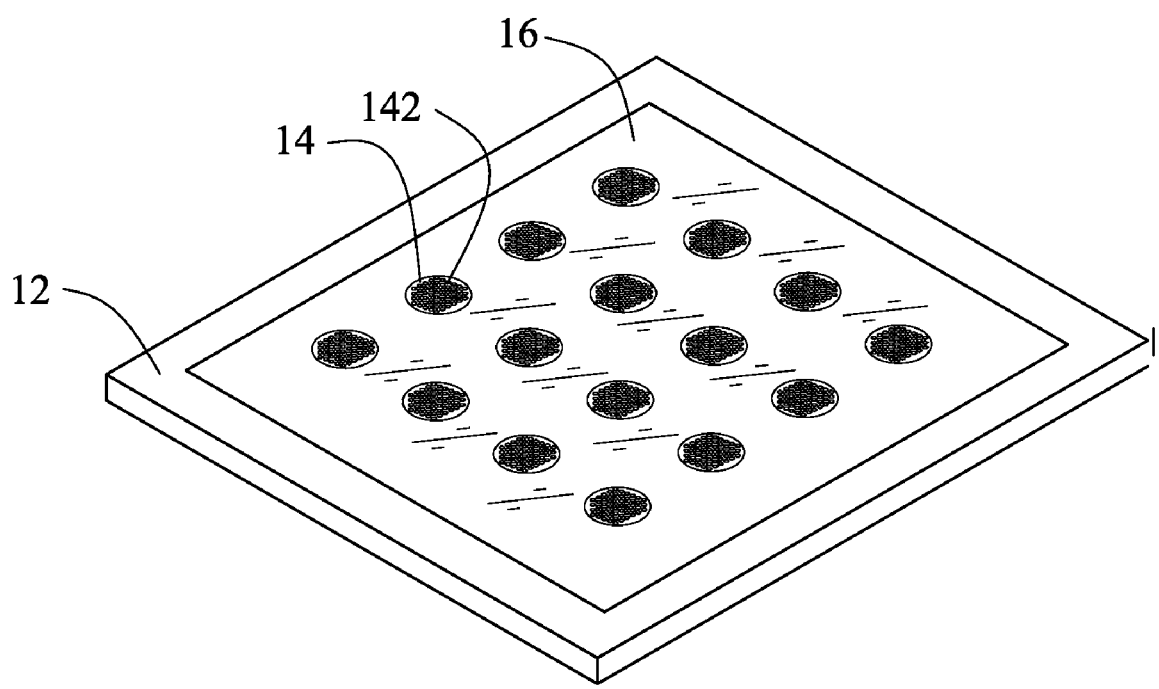
Figure 2C:
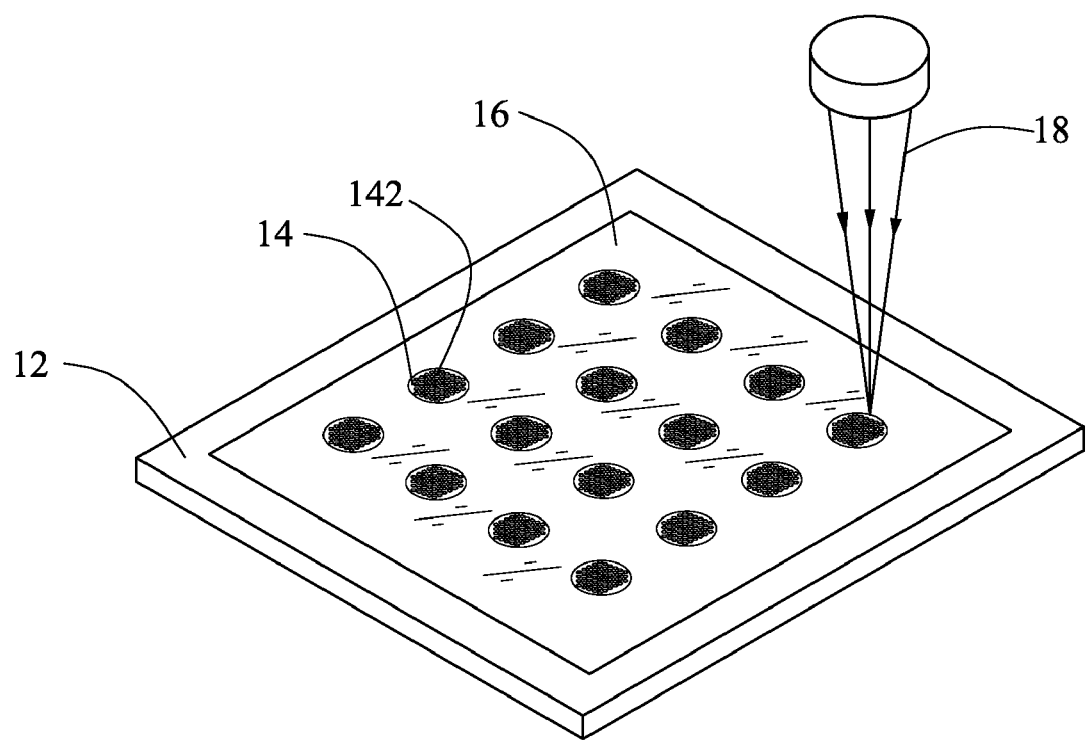
Figure 2D:
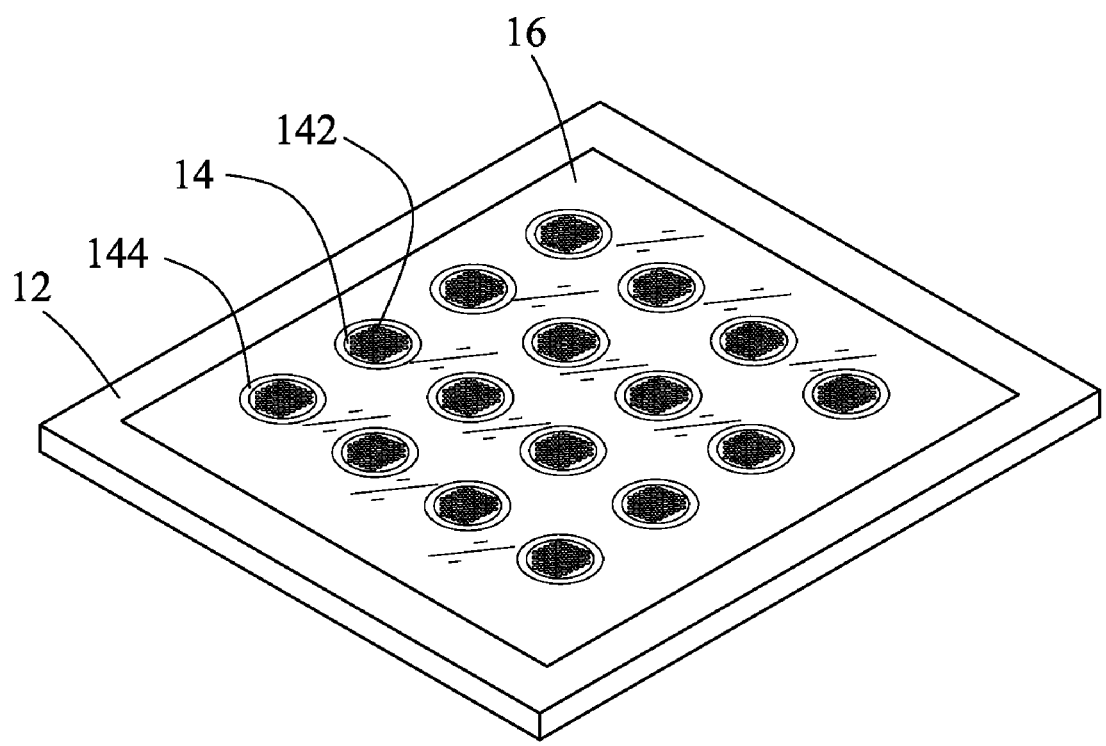

Corresponding reference characters indicate corresponding parts throughout the several views. The exemplifications set out herein illustrate at least one embodiment of the present method for fabricating a TEM grid, in one form, and such exemplifications are not to be construed as limiting the scope of the invention in any manner.

DETAILED DESCRIPTION

Reference will now be made to the drawings to describe various embodiments of the present method for fabricating a TEM grid, in detail.

Referring to FIG. 1 and FIGS. 2A-2D, a method for fabricating a TEM grid includes the steps of: (a) providing an array of carbon nanotubes (CNTs). In the present embodiment, a super-aligned array of CNTs is used.

In step (a), a CNT array be formed by the substeps of: (a1) providing a flat and smooth substrate; (a2) forming a catalyst layer on the substrate; (a3) annealing the substrate with the catalyst at a temperature in the approximate range from 700° C. to 900° C. in air for about 30 to 90 minutes; (a4) heating the substrate with the catalyst at a temperature in the approximate range from 500° C. to 740° C. with a protective gas therein; and (a5) supplying a carbon source gas for about 5 to 30 minutes and growing a super-aligned array of the CNTs from the substrate.

In step (a1), the substrate can be a P-type silicon wafer, an N-type silicon wafer, or a silicon wafer with a film of silicon dioxide thereon. A 4-inch P-type silicon wafer is used as the substrate in the present embodiment.

In step (a2), the catalyst can be made of iron (Fe), cobalt (Co), nickel (Ni), or an alloy thereof.

In step (a4), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The array of CNTs can have a height of about 50 μm to 5 mm and includes a plurality of CNTs paralleled to each other and substantially perpendicular to the substrate. The array of CNTs formed under the above conditions is essentially free of impurities, such as carbonaceous or residual catalyst particles. The CNTs in the array are packed closely together by van Der Waals force.

The method for fabricating the TEM grid further includes the steps of: (b) drawing a CNT film 16 from the array of CNTs.

In step (b), the first CNT film 16 can be drawn out from the CNT array by the substeps of: (b1) selecting a CNT segment having a predetermined width from the array of CNTs; and (b2) pulling a plurality CNT segments at an even/uniform speed to form the uniform CNT film 16.

In step (b1), the CNT segments, having a predetermined width, can be selected by using an adhesive tape as a tool to contact the array. In step (b2), the pulling direction can be substantially perpendicular to the growing direction of the array of CNTs.

More specifically, during the pulling process, as the initial CNT segments are drawn out, other CNT segments are also drawn out end to end, due to the van Der Waals force between ends of the adjacent segments. The CNT film 16 produced in such manner can be selectively formed having a predetermined width. The CNT film 16 includes a plurality of CNT segments. The CNTs in the CNT film 16 are mainly parallel to the pulling direction of the CNT film 16.

The width and length of the CNT film 16 depends on the size of the array of CNTs. In one embodiment, when the size of the substrate is 4 inches, the width of the CNT film 16 ranges from about 1 centimeter to about 10 centimeters. The distance between two adjacent CNTs in the CNT film 16 is less than 10 microns.

The method for fabricating the TEM grid further includes the steps of: (c) providing a substrate 12 and a plurality of metal grids 14 mounted on the substrate 12.

In step (c), the substrate 12 has a flat surface on which the grids 14 are mounted. The substrate 12 can be made of ceramic, metal and glass. In the present embodiment, the substrate 12 is made of ceramic. Each grid 14 comprises of metal and defines one or a plurality of through holes. Each of the through holes has a diameter ranging from about 10 microns (μm) to about 2 millimeters (mm). The diameter of each through hole is much larger than the distance between any two adjacent CNTs in the CNT film 16, or larger than the sizes of pores distributed in the CNT film structure if a plurality of stacked CNT films 16 is used.

In step (d), a plurality of CNT films 16 can be stacked and held together by van De Waals force to form a stable multilayer CNT film structure. Additionally, the angle between the aligned directions of the stacked multi-layer CNT films 16 is from 0° to about 90°. In the present embodiment, the angle is 90 degrees.

It is noted that the CNT film 16 is adhesive. As such, in step (d), the first CNT film 16 can be directly adhered to a frame. The CNT films 16 are fixed on/to the frame at a determined angle to form the multi-layer CNT film structure. The metal girds 14 are covered by the multi-layer CNT film structure.

The method for fabricating the TEM grid further includes the steps of: (e) treating the CNT film 16 with an organic solvent to increase the contact between the CNT film 16 and the metal grid 14. The organic solvent is volatile and can be selected from the group consisting of ethanol, methanol, acetone, dichloroethane, chloroform, and combinations thereof. The CNT film 16 can be treated by applying the organic solvent to the CNT film 16, such as: dropping the organic solvent from a dropper to soak the entire surface of the CNT film 16 or immersing the CNT film 16 into a container having an organic solvent therein. After being soaked by the organic solvent, CNT strings will be formed by adjacent and parallel CNTs in the CNT film 16, which are able to do so, bundling together, due to the surface tension of the organic solvent. In one aspect, part of the CNTs in the untreated CNT film 16 that are not adhered on the substrate will come into contact with the substrate after the organic solvent treatment due to the surface tension of the organic solvent. Then the contacting area of the CNT film 16 with the substrate 12 will increase, and thus, the CNT film 16 can be more firmly adhered to the surface of the substrate 12. In another aspect, due to the decrease of the specific surface area via bundling, the mechanical strength and toughness of the CNT film 16 are increased and the coefficient of friction of the CNT films 16 is reduced. Also the size of the CNT film pores will increase. Macroscopically, the CNT film 16 will be approximately uniform.

Further, the CNT film structure having desired width and length can be formed by partially overlapping a plurality of CNT films 16. In this way, the width and length of the CNT film structure are not constrained by the width and the length of the CNT film 16 extracted from the array of CNT. When stacking the CNT films 16 along different directions, intersections of CNTs will define pores to form the pore structure.

The size of pores in the CNT film structure is related to how many layers of CNT films 16 used, the more layers, the smaller the pores. For example, when the number of layers of CNT films 16 is four, the pore size ranges approximately from several nm to 1 μm. The pores can support nano-particles, nano-wires, nano-rods and so on for TEM observation analysis.

The method for fabricating the TEM grid further includes the step of: (f) removing the CNT film 16 between the plurality of grids 14 to obtain a plurality of TEM grid.

In step (f), the CNT film covering the grids is separated from the remaining CNT film. A laser beam 18 is provided to remove the remaining CNT film 16. The laser beam 18 can be generated by an argon ion laser or carbon dioxide laser to irradiate the CNT film 14. The laser beam 18 has a power of approximately 5-30 watts. The power is 18 watts in the present embodiment.

The CNTs of the CNT film 16 located between the grids 14 are removed by being irradiated with the focused laser beam 18 so that the CNT film 16 will be cut in a predetermined pattern. The laser beam 18 is focused by a lens and irradiates the surface of the CNT film 16. The spot formed by the laser beam 18 irradiating the surface of the CNT film 16 has a diameter less than the distance between neighboring metal grids 14. The distance between two neighboring metal grids 14 is in the range from 0.5 mm to 2 mm in the present embodiment. For convenience of the CNT film 16, the metal grids 14 can be closely and regularly arranged on the surface of the substrate 12. In the present embodiment, the metal grids 14 are configured as a matrix on the surface of the substrate 12. It is to be understood that the laser beam 18 can irradiate the surface of the CNT film 16 perpendicularly or from an acute angle. The CNT film 16 absorbs the laser beam energy, to react with the oxygen in the air and then decompose, thus the irradiated CNTs of the CNT film 16 will be removed.

The CNT film 16 which covers the substrate 12 and the metal grids 14 can be removed by these two methods: (1) moving to laser beam 18 to irradiate the CNT film 16 along the border of each metal grid 14 to form a separated region 144 which covers a corresponding metal grid 14, whereby the CNT film 16 covering each grid 14 is separated from the CNT film 16; (2) moving the laser beam 18 to irradiate the CNT film 16 along straight lines and rows between every two metal grids 14, to cause the separation of CNT film 16 between every two metal grids 14. In the above step (f), the moving and irradiation path of the laser beam 18 can be controlled by a computer program.

It is to be understood that the step of removing the CNT film 16 along the boarder of each grid 14 can be accomplished with other methods such as coating a photoresist layer on the surface of the CNT film 16, then using physical and chemical etching to remove the CNT film 16 from around the metal grids 14.

Figure 3:
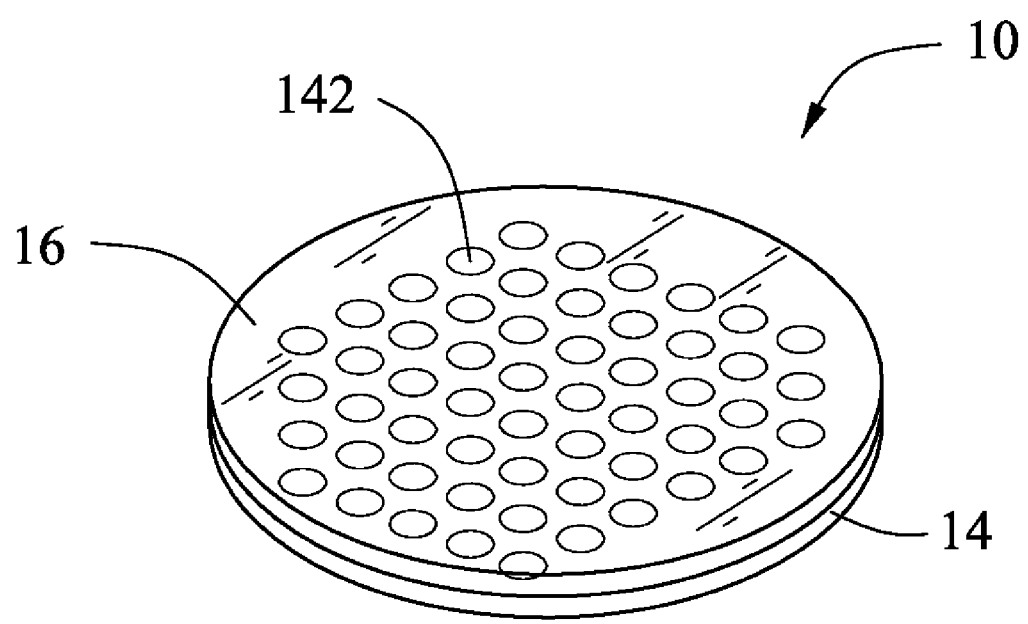
FIG. 3 is a schematic view of the TEM grid formed by the method of FIG. 1.
Figure 4:
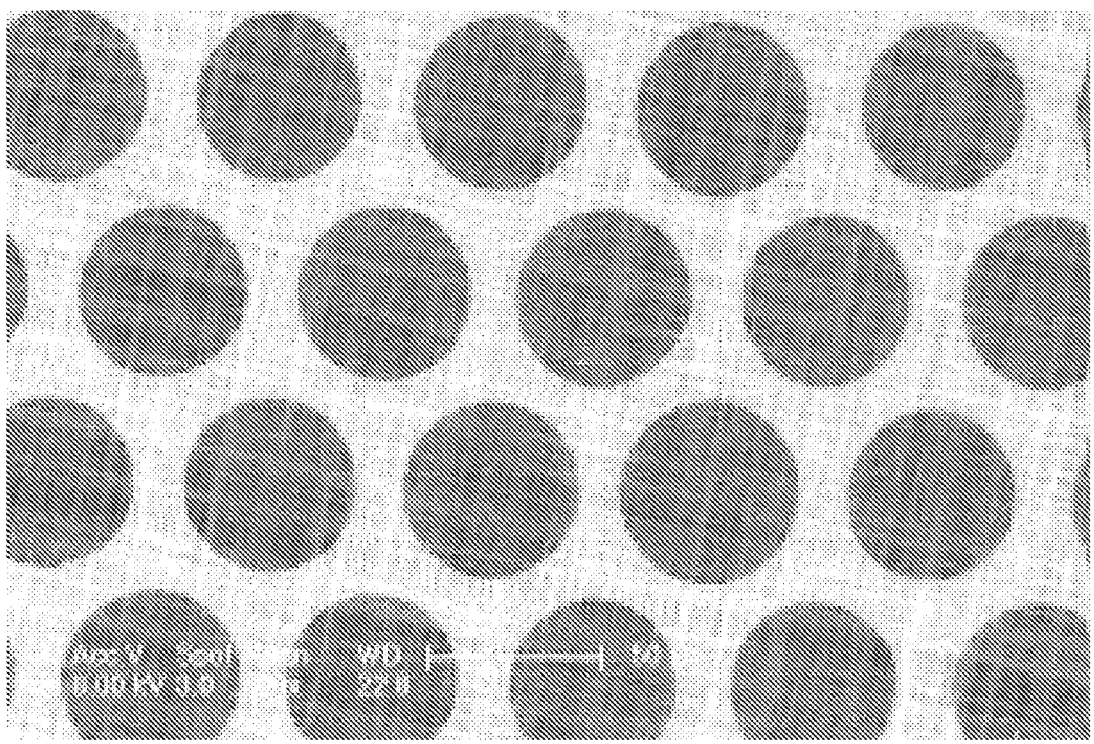
FIG. 4 shows a Scanning Electron Microscope (SEM) image of the TEM grid of FIG. 3.

Referring to FIG. 3 and FIG. 4, a TEM grid 10 fabricated using the above-mentioned method includes a metal grid 14 and a CNT film 16. The metal grid 14 having one or a plurality of through holes 142. Each of the through holes 142 has an effective diameter (e.g. the largest round object that may pass through) ranging from about 10 μm to 2 mm. The shape of the holes can vary. The metal grid 14 can be made of copper, nickel or any other metal. The diameter of each through hole 142 is much larger than the diameters of pores distributed in the CNT film structure which may be formed a plurality of CNT films 16 are stacked. The effective pore size of the CNT films 16 is dependant upon the CNT films and the CNT film structure. In the present embodiment, the size of the pores in the CNT film 16 structure range approximately from 1 nm to 10 μm.

Figure 5:
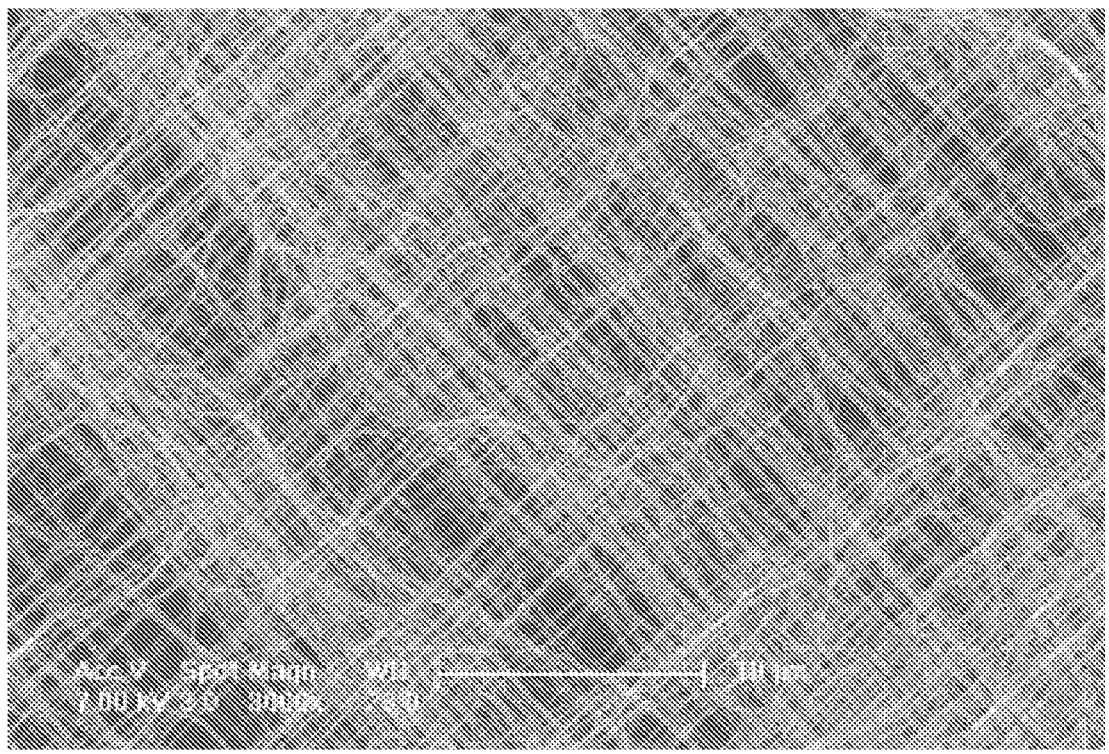
FIG. 5 shows a Transmission Electron Microscope (TEM) image of a CNT film of the TEM grid.

Referring to FIG. 5, a Scanning Electron Microscope (SEM) image of the TEM grid adopting four-layer CNT films is shown. The angle between the aligned directions of the four-layer CNT films 16 is 90 degrees. Adjacent layers of the CNT films 16 are combined by van de Waals attractive force. The CNTs in the CNT film 16 are aligned. The treated CNT film includes a plurality of carbon nanotube bundles in a preferred orientation. Bundles in two adjacent layers are crossed with each other to form a microporous structure. A diameter of the micropores is in a range from about 1 nm to about 10 μm. In addition, since the carbon nanotubes in the carbon nanotube array are of high-purity, uniform size, and have less defects, the TEM grid of the present embodiment interference to the morphology and structure of the samples to be observed and the high-resolution image of the nano-particles adsorbed on the carbon nanotubes is minimized.

The small sizes of the micropores in the microporous structure of the present embodiment can be used to support nano-materials, such as nano-particles, nano-wires, nano-sticks, for the observation thereof via TEM. When the size of the nano-particles is less than 5 nm, these nano-particles can be mainly absorbed on the walls of the CNTs and can be observed.

Figure 6:
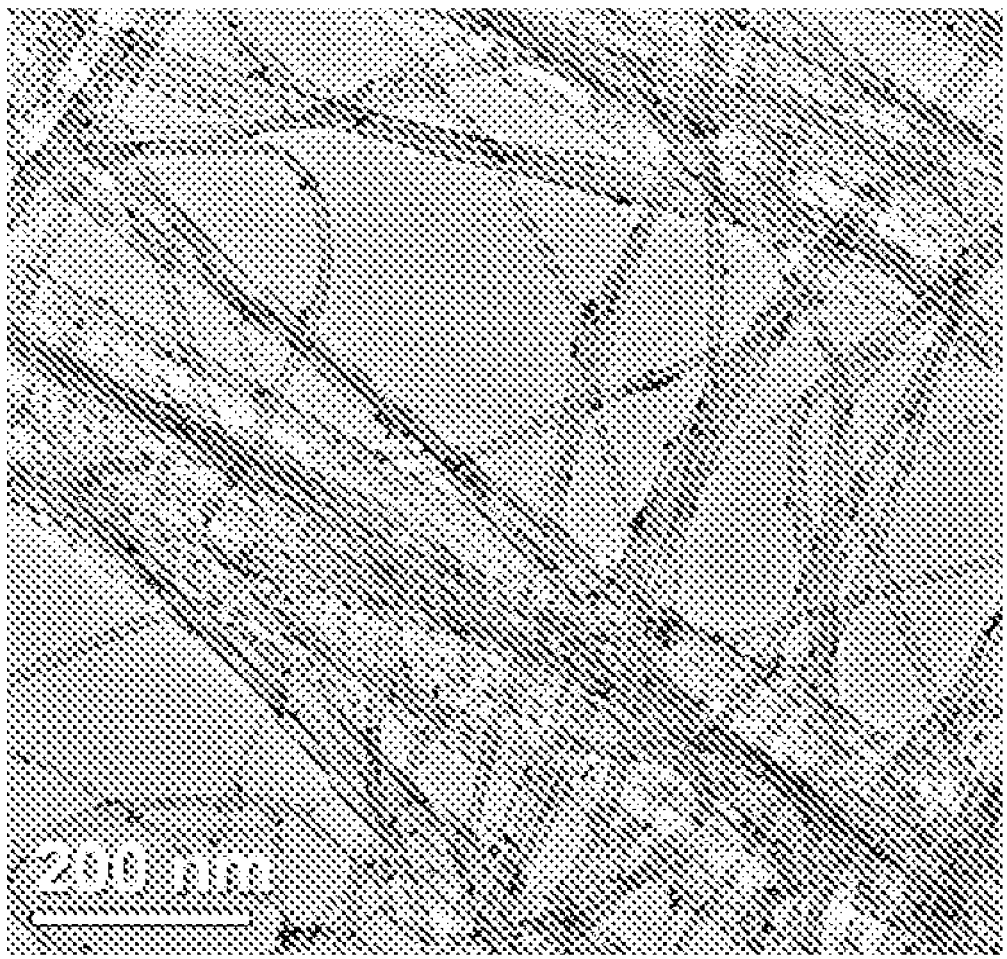
FIG. 6 shows a TEM image of gold nano-particles observed by a TEM adopting the TEM grid.
Figure 7:
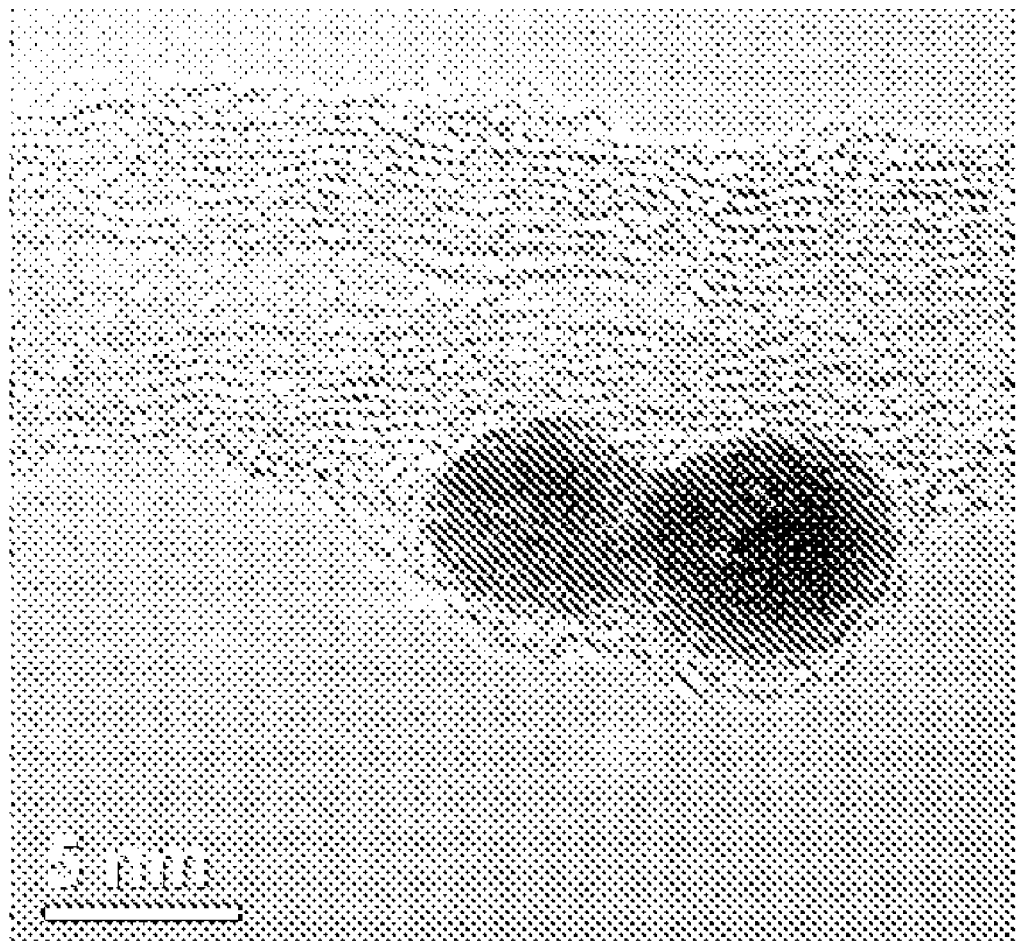
FIG. 7 is an enlarged view of FIG. 6.

Referring to FIG. 6 and FIG. 7, the dark particles are gold nano-particles to be observed according to the present embodiment. The gold nano-particles are absorbed on the walls of the CNTs and that is conductive to the observation of high-resolution image of gold nano-particles.

In addition, since the CNTs in the array of CNT are of high-purity, uniform size, and have less defects, the TEM grid of the present embodiment interference to the morphology and structure of the samples to be observed and the high-resolution image of the nano-particles absorbed on the CNTs is minimized.

The TEM grid in the present embodiment can be formed by a CNT film drawn from an array of CNTs covered, directly, on a metal grid and the method is simple, fast and conductive to large-scale production. The TEM grid made by the present method has a stable property. Also, the absorption property of the CNTs is conducive to observation of high-resolution TEM image of nano-particles with a size of less than 5 nm.

It is also to be understood that the above description and the claims drawn to a method may include some indication in reference to certain steps. However, the indication used is only to be viewed for identification purposes and not as a suggestion as to an order for the steps.

What is claimed is:

1. A method for making a transmission electron microscope (TEM) grid comprising:
   providing an array of carbon nanotubes, a substrate, and a plurality of metal girds attached on the substrate;
   drawing one or more carbon nanotube films from the array of carbon nanotubes;
   covering the substrate with one or more carbon nanotube films;
   treating the one or more carbon nanotube films with organic solvent; and
   irradiating a portion of the one or more carbon nanotube films between every two adjacent metal girds,
   further comprising stacking two or more carbon nanotube films and using the two or more carbon nanotube films to cover the grids; wherein the angle between the aligned directions of the stacked carbon nanotube films ranges from 0° to about 90°.

2. The method for making a TEM grid according to claim 1, wherein the step of irradiating the one or more carbon nanotube films further comprises the substeps of:
   providing a laser beam with a power ranging from about 5 watts to about 30 watts; and
   focusing the laser beam on the one or more carbon nanotube films along a border of each of the grids to remove the carbon nanotube film between every two adjacent metal girds.

3. The method for making a TEM grid according to claim 2, wherein the one or more carbon nanotube films is irradiated by the laser beam along the border of each of the metal grids to form a disconnect, whereby the carbon nanotube film covering the grids is separated from the remaining carbon nanotube film.

4. The method for making a TEM grid according to claim 2, wherein the carbon nanotube film is irradiated by the laser beam along straight lines and rows between every two adjacent metal grids to cause the separation of carbon nanotube film between every two adjacent metal grids.

5. The method for making a TEM grid according to claim 2, wherein the irradiation path of the laser beam is controlled by a computer program.

6. A method for making a TEM grid according to claim 1, wherein the organic solvent is volatile and is selected from the group consisting of ethanol, methanol, acetone, dichloroethane, chloroform, and combinations thereof.

7. The method for making a TEM grid according to claim 6, wherein the step of treating the carbon nanotube film is executed by applying the organic solvent to soak an entire surface of the carbon nanotube film.

8. The method for making a TEM grid according to claim 6, wherein the step of treating the carbon nanotube film is executed by immersing the metal grid with the carbon nanotube film thereon into the organic solvent.

9. The method for making a TEM grid according to claim 1, wherein the step of drawing the carbon nanotube film from the array of carbon nanotube comprising the substeps of:
   selecting carbon nanotube segment having a predetermined width from the array of carbon nanotubes; and
   pulling the carbon nanotube segment at a uniform speed to form the carbon nanotube film.

10. The method for making a TEM grid according to claim 9, wherein the carbon nanotube array is formed by the substeps of:
    providing a flat and smooth substrate;
    forming a catalyst layer on the substrate;
    annealing the substrate with the catalyst at a temperature in the approximate range from 700° C. to 900° C. in air for about 30 to 90 minutes;
    heating the substrate with the catalyst at an ambient temperature in the range from about 500° C. to about 740° C. with a protective gas;
    supplying a carbon source gas for about 5 to about 30 minutes; and
    growing an array of the carbon nanotubes from the substrate.

11. The method for making a TEM grid according to claim 1, wherein a distance between two neighboring metal grids is in a range from 0.5 mm to 2 mm.

12. A method for making a transmission electron microscope (TEM) grid, comprising:
    providing an array of carbon nanotubes, a substrate, and a plurality of metal girds attached on the substrate;
    drawing one or more carbon nanotube films from the array of carbon nanotubes;
    covering the substrate with one or more carbon nanotube films;
    treating the one or more carbon nanotube films with organic solvent; and
    irradiating a portion of the one or more carbon nanotube films between every two adjacent metal girds,
    wherein the step of irradiating the one or more carbon nanotube films further comprises the substeps of:
    providing a laser beam with a power ranging from about 5 watts to about 30 watts; and
    focusing the laser beam on the one or more carbon nanotube films along a border of each of the grids to remove the carbon nanotube film between every two adjacent metal girds.

13. The method for making a TEM grid according to claim 12, further comprising stacking two or more carbon nanotube films and using the two or more carbon nanotube films to cover the metal grids; wherein the angle between the aligned directions of the stacked carbon nanotube films ranges from 0° to about 90°.

14. A method for making a transmission electron microscope grid, comprising:
   providing an array of carbon nanotubes, a substrate, and a plurality of metal girds attached on the substrate;
   drawing one or more carbon nanotube films from the array of carbon nanotubes;
   covering the substrate with one or more carbon nanotube films;
   treating the one or more carbon nanotube films with organic solvent; and
   irradiating a portion of the one or more carbon nanotube films between every two adjacent metal girds, wherein the organic solvent is volatile and is selected from the group consisting of ethanol, methanol, acetone, dichloroethane, chloroform, and combinations thereof.

15. A method for making a transmission electron microscope grid, comprising:
   providing an array of carbon nanotubes, a substrate and a plurality of metal girds attached on the substrate;
   drawing one or more carbon nanotube films from the array of carbon nanotubes;
   covering the substrate with one or more carbon nanotube films;
   treating the one or more carbon nanotube films with organic solvent; and
   irradiating a portion of the one or more carbon nanotube films between every two adjacent metal girds,
   wherein the step of drawing the carbon nanotube film from the array of carbon nanotube comprising the substeps of:
   selecting carbon nanotube segment having a predetermined width from the array of carbon nanotubes; and
   pulling the carbon nanotube segment at a uniform speed to form the carbon nanotube film.

* * * * *